United States Patent
Kao

(10) Patent No.: US 8,773,171 B2
(45) Date of Patent: Jul. 8, 2014

(54) VOLTAGE BUFFER

(75) Inventor: Shiau-Wen Kao, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 31 days.

(21) Appl. No.: 13/584,771

(22) Filed: Aug. 13, 2012

(65) Prior Publication Data

US 2013/0257542 A1 Oct. 3, 2013

(30) Foreign Application Priority Data

Mar. 28, 2012 (TW) .............................. 101110790 A

(51) Int. Cl.
*H03K 3/00* (2006.01)

(52) U.S. Cl.
USPC ........................................................ 327/108

(58) Field of Classification Search
USPC ........................................................ 327/108
See application file for complete search history.

(56) References Cited

U.S. PATENT DOCUMENTS

| | | | |
|---|---|---|---|
| 5,451,901 A | 9/1995 | Welland | |
| 6,573,765 B2 * | 6/2003 | Bales et al. | 327/108 |
| 7,304,540 B2 | 12/2007 | Tu | |
| 7,551,029 B2 | 6/2009 | Pan | |

* cited by examiner

*Primary Examiner* — Daniel Rojas
(74) *Attorney, Agent, or Firm* — Jianq Chyun IP Office

(57) ABSTRACT

A voltage buffer having a fist transistor, a second transistor, a third transistor and a voltage detector is provided. A first terminal of the first transistor is coupled to a first reference voltage. A first terminal of the second transistor is coupled to a second terminal of the first transistor, a control terminal of the second transistor is coupled to an input voltage, and a second terminal of the second transistor is coupled to an output voltage. A first terminal of the third transistor is coupled to a second terminal of the second transistor. A second terminal of the third transistor is coupled to a second reference voltage. The voltage detector detects a voltage of the second terminal of the first transistor to generate a detection result and outputs the detection result to a bulk terminal of the second transistor.

11 Claims, 3 Drawing Sheets

VOLTAGE BUFFER

CROSS-REFERENCE TO RELATED APPLICATION

This application claims the priority benefit of Taiwan application serial no. 101110790, filed on Mar. 28, 2012. The entirety of the above-mentioned patent application is hereby incorporated by reference herein and made a part of this specification.

BACKGROUND OF THE INVENTION

1. Field of the Invention

The present invention relates to a voltage buffer, and more particularly to a voltage buffer for suppressing non-ideal effect by changing the threshold voltage of a transistor.

2. Description of Related Art

A voltage buffer is used to transmit voltage signal, enhances the driven capability and avoids loading from influencing the output of circuit. FIG. 1 is a circuit diagram illustrating a conventional power amplifier. Please referring to FIG. 1, a voltage buffer 100 includes a first, second and third transistors M1, M2 and M3, a current source $I_{REF}$, an input voltage $V_{IN}$ and an output voltage $V_{OUT}$. The first transistor M1 is coupled between a system operating voltage VCC and the second transistor M2. The current source $I_{REF}$ is coupled between the system operating voltage VCC and the third transistor M3. And the control terminals of the second and third transistors 120 and 130 are coupled to each other.

The voltage buffer 100 takes the first transistor 110 as a source follower and takes the second and third transistors 120 and 130 as a current mirror. From the transistor current formula, a bias current $I_B=I_{110}=K(V_{IN}-V_{OUT}-V_{TH,110})^2$ could be deduced, where $V_{TH,110}$ is the threshold voltage of the first transistor 110 and K is a constant. That is, when the bias current $I_B$ remains invariant, the output voltage is proportional to the input voltage $V_{IN}$.

However, with the evolution of the process, the bias current $I_B$ is prone to vary by the drain-to-source voltage. In order to mitigate the non-ideal effect generated by the variation of the bias current, a plurality of circuit design which improve the linearity by controlling the bias current are provided. However, the design of controlling the bias current directly will make the high-frequency circuit unstable, and other compensation circuits are added to stabilize the circuit. Consequently, both the complexity and cost of the circuit design are increased.

SUMMARY OF THE INVENTION

The present invention is directed to a voltage buffer for suppressing non-ideal effect by changing the threshold voltage of a transistor, so as to enhance the linearity between an output voltage and an input voltage.

The present invention provides a voltage buffer, which includes a first transistor, a second transistor, a third transistor and a voltage detector. The first transistor includes a first terminal, a control terminal and a second terminal. The first terminal of the first transistor is coupled to a first reference voltage and the control terminal of the first transistor is coupled to a first bias voltage. The second transistor includes a first terminal, a control terminal, a second terminal and a bulk terminal. The first terminal of the second transistor is coupled to the second terminal of the first transistor, the control terminal of the second transistor is coupled to an input voltage, and the second terminal of the second transistor is coupled to an output voltage. The third transistor includes a first terminal, a control terminal and a second terminal. The first terminal of the third transistor is coupled to the second terminal of the second transistor, the control terminal of the third transistor is coupled to a second bias voltage, and the second terminal of the third transistor is coupled to a second reference voltage. The voltage detector coupled between the second terminal of the first transistor and the bulk terminal of the second transistor receives and detects a voltage of the second terminal of the first transistor to generate a detection result and outputs the detection result to the bulk terminal of the second transistor.

In an embodiment of the present invention, the above-mentioned voltage detector includes a voltage division module, a current generator, and a voltage generator. The voltage division module divides the voltage of the second terminal of the first transistor to generate a first voltage. The current generator receives the first voltage and generates a current according to the first voltage. The voltage generator generates the detection result according to the current.

In an embodiment of the present invention, the above-mentioned voltage division module includes a fourth transistor and a fifth transistor. The fourth transistor includes a first terminal, a control terminal and a second terminal. The first terminal of the fourth transistor is coupled to the second terminal of the first transistor, and the control terminal of the fourth transistor is coupled to a third bias voltage. The fifth transistor includes a first terminal, a control terminal and a second terminal. The first terminal of the fifth transistor is coupled to the second terminal of the fourth transistor, the control terminal of the fifth transistor is coupled to the second bias voltage, and the second terminal of the fifth transistor is coupled to the second reference voltage.

In an embodiment of the present invention, the above-mentioned current generator includes a sixth transistor, which includes a first terminal, a control terminal and a second terminal. The control terminal of the sixth transistor is coupled to the first terminal of the fifth transistor and the second terminal of the sixth transistor is coupled to the second reference voltage.

In an embodiment of the present invention, the above-mentioned voltage generator includes a seventh transistor, which includes a first terminal, a control terminal and a second terminal. The first terminal of the seventh transistor is coupled to the first reference voltage, the control terminal of the seventh transistor is coupled to the bulk terminal of the second transistor, the second terminal of the seventh transistor is coupled to the first terminal of the sixth transistor, and the second terminal of the seventh transistor is coupled to the control terminal of the seventh transistor.

In an embodiment of the present invention, when the above-mentioned first reference voltage is a system operating voltage and the second reference voltage is a ground voltage, the first, fourth and seventh transistors are PMOS transistors and the second, third, fifth and sixth transistors are NMOS transistors.

In an embodiment of the present invention, when the above-mentioned first reference voltage is a ground voltage and the second reference voltage is a system operating voltage, the first, fourth and seventh transistors are NMOS transistors and the second, third, fifth and sixth transistors are PMOS transistors.

Based on the above descriptions, the voltage buffer of the present invention changes the equivalent threshold voltage of the transistor by providing a feedback voltage to the bulk terminal of the transistor, such that the generation of non-ideal effect could be suppressed effectively and the linearity between the output voltage and the input voltage could be enhanced.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
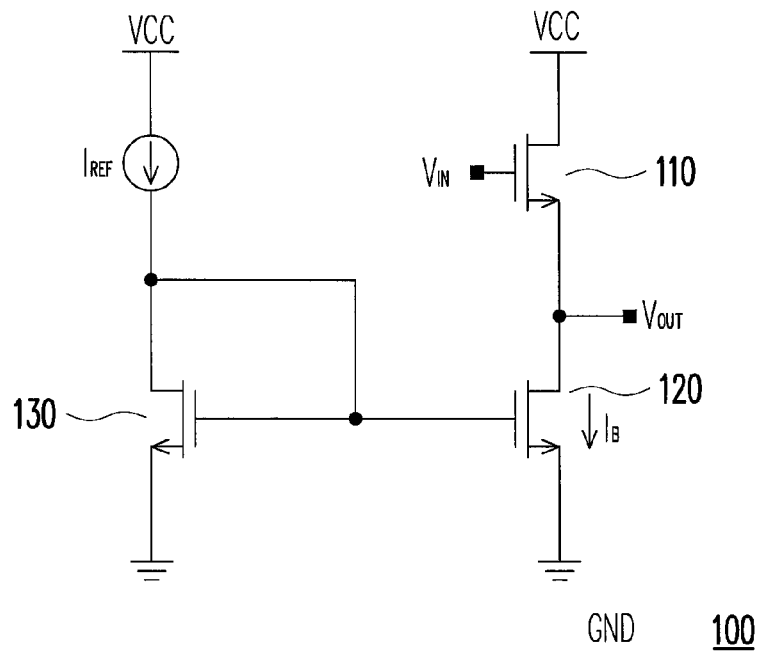
FIG. 1 is a circuit diagram illustrating a conventional power amplifier.
Figure 2:
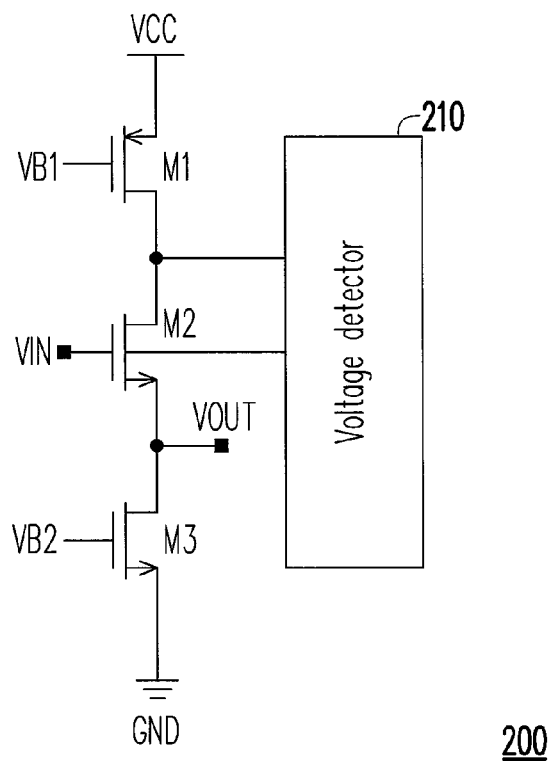
FIG. 2 is a circuit diagram illustrating a voltage buffer according to an embodiment of the present invention.

FIG. 2 is a circuit diagram illustrating a voltage buffer according to an embodiment of the present invention. Please referring to FIG. 2, a voltage buffer 200 includes a first transistor M1, a second transistor M2, a third transistor M3 and a voltage detector 210. In the present embodiment, the first transistor M1 is a PMOS transistor and both the second transistor M2 and the third transistor M3 are NMOS transistors. The first, second and third transistors are coupled between a system operating voltage VCC and a ground voltage GND.

Specifically, the first transistor M1 has a first terminal (i.e. source terminal), a control terminal (i.e. gate terminal) and a second terminal (i.e. drain terminal). The source terminal of the first transistor M1 is coupled to the system operating voltage VCC (i.e. first reference voltage) and the gate terminal of the first transistor M1 is coupled to a bias voltage VB1. The second transistor M2 has a first terminal (i.e. source terminal), a control terminal (i.e. gate terminal), a second terminal (i.e. drain terminal) and a bulk terminal (i.e. base terminal). The drain terminal of the second transistor M2 is coupled to the drain terminal of the first transistor M1, the gate terminal of the second transistor M2 is coupled to an input voltage VIN, and the source terminal of the second transistor M2 is coupled to an output voltage VOUT. The third transistor M3 includes a first terminal (i.e. source terminal), a control terminal (i.e. gate terminal) and a second terminal (i.e. drain terminal). The drain terminal of the third transistor M3 is coupled to the source terminal of the second transistor M2, the gate terminal of the third transistor M3 is coupled to a second bias voltage VB2, and the source terminal of the third transistor M3 is coupled to a ground voltage (i.e. second reference voltage).

The voltage detector 210 is coupled between the drain terminal of the first transistor M1 and the base terminal of the second transistor M2. The voltage detector 210 receives and detects a voltage of the drain terminal of the first transistor M1 to generate a feedback voltage and outputs the feedback voltage to the base terminal of the second transistor M2. The voltage detector 210 adjusts a base potential of the second transistor M2. When the input voltage VIN rises, the voltage detector 210 generates a feedback voltage such that the base potential of the second transistor M2 rises as well; when the input voltage VIN drops, the voltage detector 210 generates a feedback voltage such that the base potential of the second transistor M2 drops as well. Accordingly, the generation of non-ideal effect could be suppressed effectively by changing the equivalent threshold voltage of the second transistor M2, that is, the linearity between the output voltage VOUT and the input voltage VIN could be enhanced.

Figure 3:
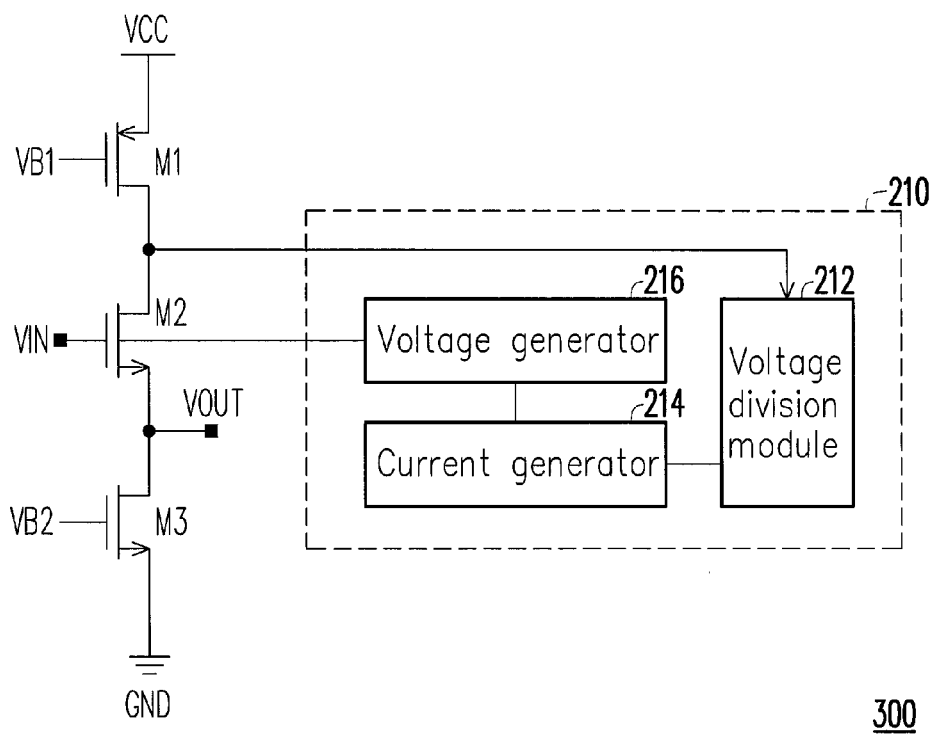
FIG. 3 is a circuit diagram illustrating a voltage buffer according to another embodiment of the present invention.

FIG. 3 is a circuit diagram illustrating a voltage buffer according to another embodiment of the present invention. It should be noted that FIG. 3 is an implementation way of embodiment of the voltage buffer 200 in FIG. 2.

The voltage buffer 300 includes the first transistor M1, the second transistor M2, the third transistor M3 and the voltage detector 210, which the voltage detector 210 further includes a voltage division module 212, a current generator 214, and a voltage generator 216. In the embodiment, the first transistor M1 is a PMOS transistor, the second and third transistors M2 and M3 are NMOS transistors, the connection relationship of the first, second and third transistors M1, M2 and M3 is the same as the aforementioned embodiment, and therefore it is not repeated herein.

The voltage division module 212 receives a voltage of the drain terminal of the first transistor M1 first, and then performs the voltage division on the voltage so as to generate a first voltage V1 to the current generator 214. The current generator 214 receives the first voltage V1 and generates a current I1 according to the first voltage V1. The voltage generator 216 is driven by the current I1 to generate the feedback voltage and outputs the feedback voltage to the base terminal of the second transistor M2.

Figure 4:
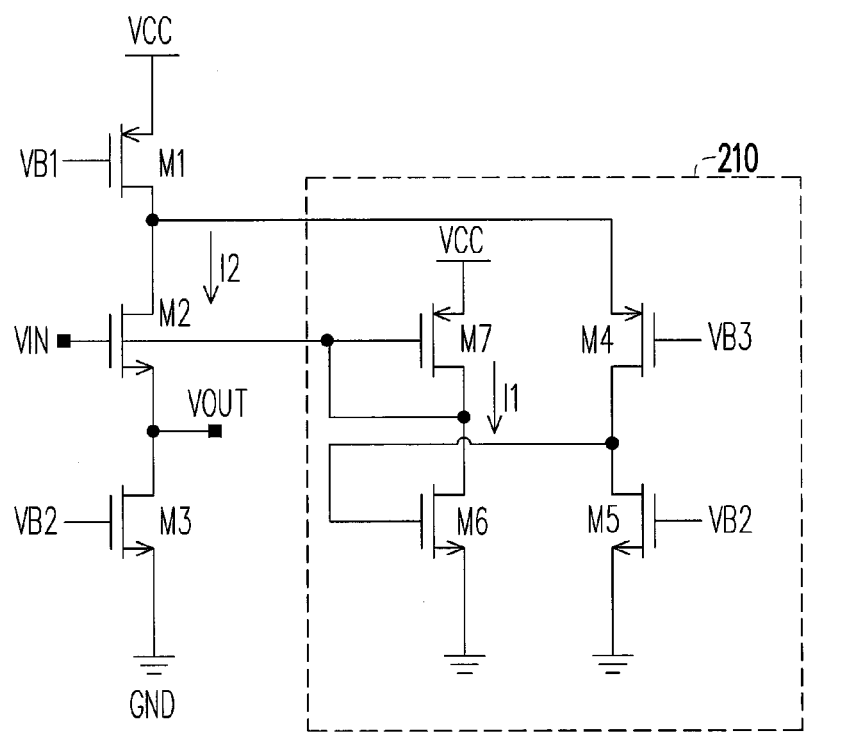
FIG. 4 is a circuit diagram illustrating a voltage buffer according to yet another embodiment of the present invention.

FIG. 4 is a circuit diagram illustrating a voltage buffer according to yet another embodiment of the present invention. It should be noted that FIG. 4 is a detailed way of embodiment of the voltage buffer 200 in FIG. 2.

The voltage buffer 400 includes the first, second, third, fourth, fifth, sixth and seventh transistors M1, M2, M3, M4, M5, M6 and M7. In the present embodiment, the first, fourth and seventh transistors M1, M4 and M7 are PMOS transistors and the second, third, fifth and sixth transistors M2, M3, M5 and M6 are NMOS transistors. Detailed description of the following is for the fourth to seventh transistors M4-M7.

The fourth transistor M4 has a first terminal (i.e. source terminal), a control terminal (i.e. gate terminal) and a second terminal (i.e. drain terminal). The source terminal of the fourth transistor M4 is coupled to the drain terminal of the first transistor M1 and the gate terminal of the fourth transistor M4 is coupled to a third bias voltage VB3. The fifth transistor M5 has a first terminal (i.e. source terminal), a control terminal (i.e. gate terminal) and a second terminal (i.e. drain terminal). The drain terminal of the fifth transistor M5 is coupled to the drain terminal of the fourth transistor M4, the gate terminal of the fifth transistor M5 is coupled to the second bias voltage VB2, and the source terminal of the fifth transistor M5 is coupled to the ground voltage GND. In the present embodiment, the usage of the fourth and fifth transistors M4 and M5 is an implementation way of embodiment of the voltage division module 212 in FIG. 3.

The sixth transistor M6 has a first terminal (i.e. source terminal), a control terminal (i.e. gate terminal) and a second terminal (i.e. drain terminal). The gate terminal of the sixth transistor M6 is coupled to the drain terminal of the fifth transistor M5 and the source terminal of the sixth transistor M6 is coupled to the ground voltage GND. In the present embodiment, the usage of the sixth transistor M6 is an implementation way of embodiment of the current generator 214 in FIG. 3. The seventh transistor M7 has a first terminal (i.e. source terminal), a control terminal (i.e. gate terminal) and a second terminal (i.e. drain terminal). The source terminal of the seventh transistor M7 is coupled to the system operating voltage VCC, the gate terminal of the seventh transistor M7 is coupled to the base terminal of the second transistor M2, the drain terminal of the seventh transistor M7 is coupled to the drain terminal of the sixth transistor M6. Besides, the drain terminal of the seventh transistor M7 is further coupled to the gate terminal of the seventh transistor M7. In the present embodiment, the usage of the seventh transistor M7 is an implementation way of embodiment of the voltage generator 216 in FIG. 3.

When the second transistor M2 of the voltage buffer 400 receives the input voltage VIN, the source terminal of the fourth transistor M4 receives and detects the voltage of the drain terminal of the first transistor M1, and a divided voltage is generated by operating the fourth and fifth transistors M4 and M5. The divided voltage is provided to the sixth transistor M6 according to the connection relationship between the drain terminal of the fifth transistor M5 and the gate terminal of the sixth transistor M6. After receiving the divided voltage, the sixth transistor M6 drives the system operating voltage VCC to generate a current I1 through the sixth and seventh transistors M6 and M7. When the current I1 passes through the seventh transistor M7, the feedback voltage is generated and transmitted to the base terminal of the second transistor M2.

In terms of the overall operation, when the input voltage VIN rises, the feedback voltage which is transmitted to the base terminal of the second transistor M2 from the gate terminal of the seventh transistor M7 rises as well. When the input voltage VIN drops, the feedback voltage which is transmitted to the base terminal of the second transistor M2 from the gate terminal of the seventh transistor M7 drops as well. According to the above-mentioned operation, a bias current I2 which passes through the second transistor M2 remains stable. The formula of calculating the bias current I2 is shown as following:

$$I2 = K(VIN - VOUT - VTH)^2 \quad (1)$$

Where, K is a constant and VTH is the threshold voltage of the second transistor M2.

A partial differential operation is performed on the input voltage VIN in the formula (1) and a following result is obtained:

$$\frac{\partial}{\partial VIN}\left[\sqrt{\frac{I2}{K}}\right] + \frac{\partial}{\partial VIN}[VTH] = 1 - \frac{\partial}{\partial VIN}[VOUT] = t \quad (2)$$

Where, t is a constant. It could be found that if two items of the left part of the formula (2)

$$\left(i.e. \ \frac{\partial}{\partial VIN}\left[\sqrt{\frac{I2}{K}}\right] \text{ and } \frac{\partial}{\partial VIN}[VTH]\right)$$

maintain as a constant, then the relationship between the output voltage VOUT and the input voltage VIN is first order linear relationship. Therefore, the overall circuit has high linearity performance. However, the bias current I2 of the second transistor M2 is positive correlation with the output voltage VOUT and the input voltage VIN. Thus, formula (3) is used to compensate a non-ideal effect due to the variation of the bias current I2 in conventional circuit design.

$$\frac{\partial}{\partial VIN}\left[\sqrt{\frac{I2}{K}}\right] + \frac{\partial}{\partial VIN}[-\Delta I] = 1 - \frac{\partial}{\partial VIN}[VOUT] = t \quad (3)$$

Where, formula (3) is deduced by setting $$\frac{\partial}{\partial VIN}[VTH]$$

in formula (2) to be zero and introducing a current variance ΔI to compensate the variation of the bias current I2.

However, as described in related art, the problem with unstable high-frequency circuit usually exists in such bias circuit which is designed by compensating the variation of the bias current. Thus, in the present invention, formula (4) is provided to design a voltage buffer with variation of the transistor threshold voltage, so as to obtain the same linearity performance.

$$\frac{\partial}{\partial VIN}\left[\sqrt{\frac{I2}{K}}\right] + \frac{\partial}{\partial VIN}[-\Delta VTH] = 1 - \frac{\partial}{\partial VIN}[VOUT] = t \quad (4)$$

The threshold voltage variance ΔVTH is used to design the voltage buffer of the present invention. It not only achieves the same linearity performance as formula (3) but also avoids the characteristic of unstable high-frequency circuit.

Figure 5:
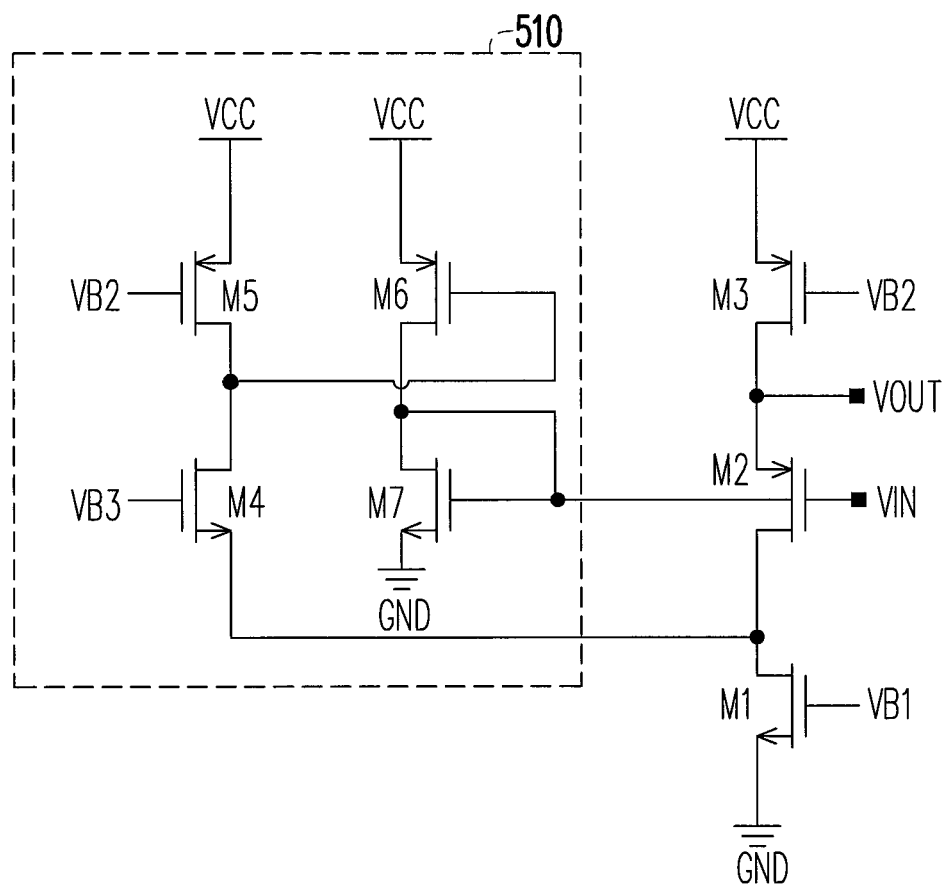
FIG. 5 is a circuit diagram illustrating a voltage buffer according to still another embodiment of the present invention.

It is worthy to note that the PMOS transistors of the voltage buffer 400 in FIG. 4 could be implemented by NMOS transistors; on the contrary, the NMOS transistors of the voltage buffer 400 could be implemented by PMOS transistors. The implementation way is shown in FIG. 5. FIG. 5 is a circuit diagram illustrating a voltage buffer according to still another embodiment of the present invention.

Please referring to FIG. 5, the voltage buffer 500 includes the first, second, third, fourth, fifth, sixth and seventh transistors M1, M2, M3, M4, M5, M6 and M7. In the present embodiment, the first, fourth and seventh transistors M1, M4 and M7 are NMOS transistors and the second, third, fifth and sixth transistors M2, M3, M5 and M6 are PMOS transistors. In other words, the voltage buffer 500 as shown in FIG. 5 is the complementary embodiment of the voltage buffer 400 as shown in FIG. 4.

The first, second and third transistors are coupled in series between the ground voltage GND (i.e. first reference voltage) and the system operating voltage VCC (i.e. second reference voltage).

In the present embodiment, the fourth, fifth, sixth and seventh transistors M4, M5, M6 and M7 are taken as the voltage detector 510 of the voltage buffer 500. The voltage detector 510 is coupled between the drain terminal of the first transistor M1 and the base terminal of the second transistor M2. The voltage detector 510 receives and detects a voltage of the drain terminal of the first transistor M1 to generate a feedback voltage, and the feedback voltage is outputted to the base terminal of the second transistor M2. In terms of the overall operating and other detailed description of the present embodiment is the same as or similar to the aforementioned embodiments, and thus not repeated herein.

In summary, in the present invention, the equivalent threshold voltage of the transistor is changed by providing a feedback voltage to the base terminal of the transistor, such that the generation of non-ideal effect could be suppressed effectively and the linearity between the output voltage and the input voltage could be enhanced. Accordingly, the problem with unstable high-frequency circuit is avoided by using the design of the present invention.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A voltage buffer, comprising:
   a first transistor, having a first terminal, a control terminal and a second terminal, wherein the first terminal of the first transistor is coupled to a first reference voltage and the control terminal of the first transistor is coupled to a first bias voltage;
   a second transistor, having a first terminal, a control terminal, a second terminal and a bulk terminal, wherein the first terminal of the second transistor is coupled to the second terminal of the first transistor, the control terminal of the second transistor is coupled to an input voltage, and the second terminal of the second transistor is coupled to an output voltage;
   a third transistor, having a first terminal, a control terminal and a second terminal, wherein the first terminal of the third transistor is coupled to the second terminal of the second transistor, the control terminal of the third transistor is coupled to a second bias voltage, and the second terminal of the third transistor is coupled to a second reference voltage; and
   a voltage detector, coupled between the second terminal of the first transistor and the bulk terminal of the second transistor, receiving and detecting a voltage of the second terminal of the first transistor to generate a detection result and outputting the detection result to the bulk terminal of the second transistor.

2. The voltage buffer as claimed in claim 1, wherein the voltage detector comprises:
   a voltage division module, dividing the voltage of the second terminal of the first transistor to generate a first voltage;
   a current generator, receiving the first voltage and generating a current according to the first voltage; and
   a voltage generator, generating the detection result according to the current.

3. The voltage buffer as claimed in claim 2, wherein the voltage division module comprises:
   a fourth transistor, having a first terminal, a control terminal and a second terminal, wherein the first terminal of the fourth transistor is coupled to the second terminal of the first transistor, and the control terminal of the fourth transistor is coupled to a third bias voltage; and
   a fifth transistor, having a first terminal, a control terminal and a second terminal, wherein the first terminal of the fifth transistor is coupled to the second terminal of the fourth transistor, the control terminal of the fifth transistor is coupled to the second bias voltage, and the second terminal of the fifth transistor is coupled to the second reference voltage.

4. The voltage buffer as claimed in claim 3, wherein the current generator comprises:
   a sixth transistor, having a first terminal, a control terminal and a second terminal, wherein the control terminal of the sixth transistor is coupled to the first terminal of the fifth transistor and the second terminal of the sixth transistor is coupled to the second reference voltage.

5. The voltage buffer as claimed in claim 4, wherein the voltage generator comprises:
   a seventh transistor, having a first terminal, a control terminal and a second terminal, wherein the first terminal of the seventh transistor is coupled to the first reference voltage, the control terminal of the seventh transistor is coupled to the bulk terminal of the second transistor, the second terminal of the seventh transistor is coupled to the first terminal of the sixth transistor, and the second terminal of the seventh transistor is coupled to the control terminal of the seventh transistor.

6. The voltage buffer as claimed in claim 5, wherein the first reference voltage is a system operating voltage and the second reference voltage is a ground voltage.

7. The voltage buffer as claimed in claim 6, wherein the first transistor, the fourth transistor and the seventh transistor are PMOS transistors.

8. The voltage buffer as claimed in claim 6, wherein the second transistor, the third transistor, the fifth transistor and the sixth transistor are NMOS transistors.

9. The voltage buffer as claimed in claim 5, wherein the first reference voltage is a ground voltage and the second reference voltage is a system operating voltage.

10. The voltage buffer as claimed in claim 9, wherein the first transistor, the fourth transistor and the seventh transistor are NMOS transistors.

11. The voltage buffer as claimed in claim 9, wherein the second transistor, the third transistor, the fifth transistor and the sixth transistor are PMOS transistors.

* * * * *